United States Patent
Darmawikarta et al.

(10) Patent No.: US 9,953,959 B1
(45) Date of Patent: Apr. 24, 2018

(54) METAL PROTECTED FAN-OUT CAVITY

(71) Applicant: Intel Corporation, Santa Clara, CA (US)

(72) Inventors: Kristof Darmawikarta, Chandler, AZ (US); Robert Alan May, Chandler, AZ (US); Yikang Deng, Chandler, AZ (US); Amruthavalli Pallavi Alur, Tempe, AZ (US); Sheng Li, Gilbert, AZ (US); Chong Zhang, Chandler, AZ (US); Sri Chaitra Jyotsna Chavali, Chandler, AZ (US); Amanda E. Schuckman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/463,523

(22) Filed: Mar. 20, 2017

(51) Int. Cl.
| | |
|---|---|
| *H01L 23/02* | (2006.01) |
| *H01L 25/065* | (2006.01) |
| *H01L 25/00* | (2006.01) |
| *H01L 21/48* | (2006.01) |

(52) U.S. Cl.
CPC ........ *H01L 25/0657* (2013.01); *H01L 21/486* (2013.01); *H01L 21/4817* (2013.01); *H01L 25/50* (2013.01); *H01L 2225/0652* (2013.01); *H01L 2225/06548* (2013.01)

(58) Field of Classification Search
CPC . H01L 25/0657; H01L 25/50; H01L 21/4817; H01L 21/486; H01L 23/053; H01L 23/055; H01L 2225/0652; H01L 2225/06548
USPC .......................................... 257/686
See application file for complete search history.

(56) References Cited

U.S. PATENT DOCUMENTS

| | | | | |
|---|---|---|---|---|
| 8,138,515 B2 * | 3/2012 | Zeng | ..................... | H01L 33/486 257/98 |
| 8,810,024 B2 * | 8/2014 | Lin | ......................... | H01L 23/13 257/621 |

* cited by examiner

*Primary Examiner* — Tu-Tu Ho
(74) *Attorney, Agent, or Firm* — Schwegman Lundberg & Woessner, P.A.

(57) ABSTRACT

A metal protected fan-out cavity enables assembly of a package-on-package (PoP) integrated circuit while reducing PoP solder spacing and overall z-height. A horizontal fan-out conductor provides a contact between a die contact and a lower package via. A metal protection layer may be used during manufacture to protect the fan-out conductor, such as providing a laser stop during laser skiving. The metal protection layer materials and an etching solution may be selected to allow for subsequent removal via etching while leaving the fan-out conductor intact. The metal protection layer and fan-out conductor materials may also be selected to reduce or eliminate formation of an intermetallic compound (IMC) between the metal protection layer and the fan-out conductor.

8 Claims, 4 Drawing Sheets

METAL PROTECTED FAN-OUT CAVITY

TECHNICAL FIELD

Embodiments described herein generally relate to electrical interconnections in electronic devices.

BACKGROUND

One or more integrated circuits (ICs) are often implemented as an IC package. During manufacturing of an electronic device, multiple packages may be combined in a package-on-package (PoP) configuration. The PoP manufacturing process typically includes disposing solder balls on an array of contacts on a first package (i.e., a ball grid array (BGA)), placing a second package on the BGA, and reflowing the solder to create electrical and mechanical connections between the two packages. An interposer with at least one BGA may be used to connect two packages. For example, two packages may include BGAs of different solder ball spacing (e.g., solder ball pitch) or different arrangements of solder ball, and an interposer may include a first BGA pitch to connect to a first package, and a second BGA pitch to connect to a second package.

Due to requirements for minimum solder ball spacing (e.g., requirements for minimum pitch), the reduction in size of PoP architecture is limited to minimum requirements for the PoP interconnect pitch. In an example, in order to provide enough standoff height for the die thickness, the solder balls used for PoP interconnect need to be larger than certain minimum solder ball size. This minimum solder ball size limits the density of solder balls (e.g., PoP pitch) that can be placed within an area. Typically, PoP pitch based on through-mold via (TMV) or through-silicon via (TSV) architecture includes a minimum pitch of approximately 350 μm between solder ball contacts. The solder ball size and package heights also result in a minimum PoP z-height. It is desirable to improve the PoP interconnect pitch and reduce the PoP z-height to allow for a further reduction in size of PoP architecture.

DESCRIPTION OF EMBODIMENTS

The technology described herein provides technical solutions to technical problems facing PoP interconnect pitch limitations. A reduction in PoP interconnect pitch is possible when a die (e.g., IC component) is placed within (e.g., embedded) a cavity formed within the lower package substrate. The die may be placed fully or partially within the cavity. This embedding within the cavity also reduces the overall PoP z-height.

To enable the use of a PoP cavity, the lower package contacts are electrically and mechanically connected to die contacts. However, when die contacts are arranged in a different configuration or pitch from the lower package contacts, additional conductor traces are needed. For the vertical conductive through-mold via (TMV) architecture, a horizontal fan-out conductor provides an electrical contact between a lower package via and a die contact.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
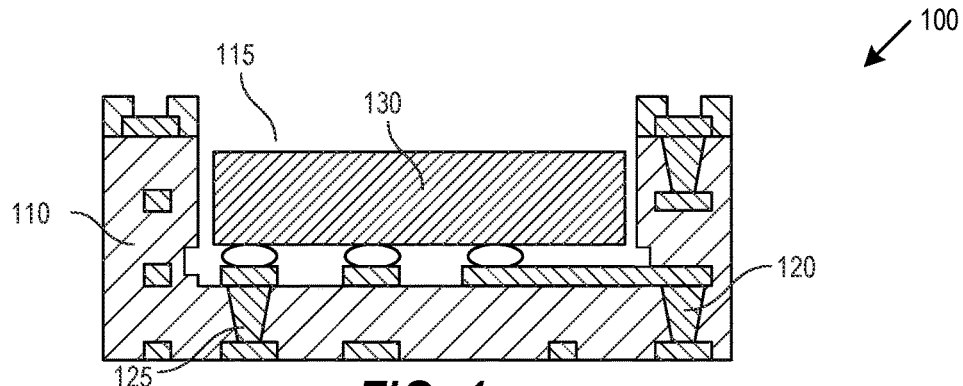
FIG. 1 is a block diagram of an assembled fan-out cavity PoP structure, in accordance with at least one embodiment of the invention.

FIG. 1 is a block diagram of an assembled fan-out cavity structure 100, in accordance with at least one embodiment of the invention. The structure 100 includes a substrate 110 (e.g., dielectric), which includes a fan-out via 120 and a vertical via 125. The substrate 110 includes a cavity 115, and a die 130 may be placed within the cavity 115. The fan-out via 120 and a vertical via 125 provide escape routing traces (e.g., conductive traces) to contacts on a bottom surface of the substrate 110. As shown in FIG. 1, fan-out via 120 provides a connection between the die 130 and a lower contact beyond the width of the die 130, all while supporting standard vertical via connections. Fan-out via 120 can also provide a vertical connection to an upper contact without going through the lower layer first, where a routing through the lower layer would otherwise be required using standard vertical via connection. The substrate 110 may be implemented as a portion of an IC package or may be implemented as an interposer to be placed between die 130 and a lower package (not shown).

The cavity 115 within the substrate 110 may be formed using various manufacturing architectures. The cavity 115 may be formed by drilling within the substrate 110. To reduce or eliminate damage to nearby components due to drilling, a keep-out zone may be used around the cavity 115 to avoid drilling into one or more nearby components. The cavity 115 may be formed by creating and removing a removable layer with the substrate 110, such as by creating a release layer between the removable layer and the substrate 110. The use of a release layer may leave a release layer residue or removable layer residue, and this residue may be removed to avoid creating issues with subsequent processing steps. The cavity 115 may be formed by using laser trimming (e.g., laser skiving) to remove a portion of the substrate 110. For example, a laser may be used to cut a perimeter around a rectangular portion of the substrate 110, and the rectangular portion is removed to form the cavity 115. To expose vias and other contacts within the substrate 110, a metal laser stop perimeter may be disposed on the bottom of the cavity 115 to ensure the laser trims to the desired depth of the cavity 115. While a metal laser stop perimeter may be used to expose one or more vias 125 or other contacts within the boundaries of the cavity 115, the metal laser stop perimeter may transect the upper conductive portion of the fan-out via 120. The use of a metal laser stop perimeter may cause an undesirable change in the impedance or other electrical characteristic of the fan-out via 120, and may create an undesirable electrical connection (e.g., a short circuit) between the fan-out via 120 and another fan-out via. To provide correct depth and avoid an undesired electrical connection between a metal laser stop perimeter and a fan-out via, a metal protection layer may be used, such as shown in FIGS. 2A-2I.

FIGS. 2A-2I are block diagrams of a metal protection layer assembly 200, in accordance with at least one embodiment of the invention. Assembly 200 includes application (e.g., electroplating) of a metal protection layer on top of existing routing traces during substrate manufacturing. This metal protection layer functions as a laser stop layer during laser skiving. Suitable selection of the metal protection layer material composition allows the metal protection layer to be etched following cavity formation by laser skiving. This etching of the metal protection layer leaves intact any vias and fan-out routing traces within the cavity. The process flow in FIGS. 2A-2I can be seamlessly integrated into a Semi-Additive Process (SAP) manufacturing flow, a Modified SAP (MSAP) manufacturing flow, or another manufacturing architecture.

Figure 2A:
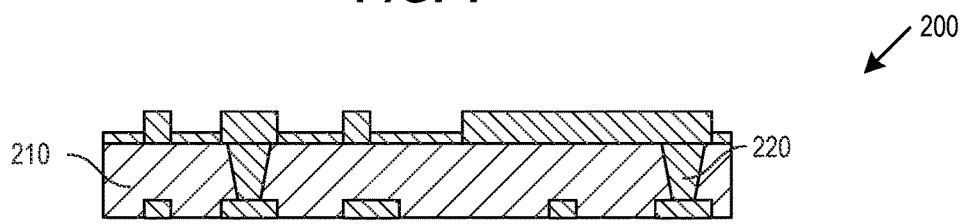
FIGS. 2A-2I are block diagrams of a metal protection layer assembly, in accordance with at least one embodiment of the invention.
Figure 2B:
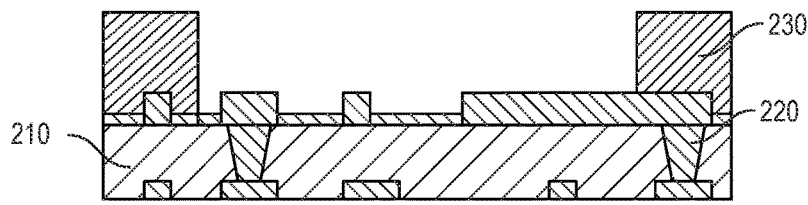

FIG. 2A shows a substrate 210 (e.g., dielectric) with cavity routing interconnects 220 (e.g., traces, vias). These routing traces are electrically connected, and may include one or more vias or fan-out vias. FIG. 2B shows an addition of a protection layer border 230. The protection layer border 230 may be implemented as a patterned dry film resist (DFR) layer that serves as a border (e.g., outer perimeter) for the subsequent metal protection layer.

Figure 2C:
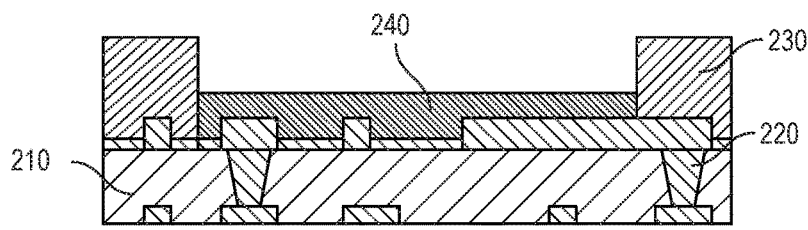

FIG. 2C shows electroplating of the metal protection layer 240 on the cavity routing interconnects 220 and within the protection layer border 230. The material composition of the metal protection layer 240 is selected to include a high etching selectivity against the conductive material within the cavity routing interconnects 220. In an example, nickel (Ni) or tin (Sn) may be used in the metal protection layer 240 when copper (Cu) is used in the cavity routing interconnects 220. When exposed to a chemical etching compound (e.g., ferric chloride, ammonium persulfate), nickel and copper may be removed at different rates. The etching rate of nickel is greater than the etching rate of copper, and in some examples, nickel shows a 10:1 ratio of greater etch selectivity than copper.

Subsequent manufacturing process steps may be selected based on the materials used within the metal protection layer 240 and cavity routing interconnects 220. For example, to avoid forming an intermetallic compound (IMC) between copper and tin layers, lower temperatures may be used in subsequent manufacturing process steps, such as in curing layers that have been pre-impregnated with a resin (e.g., prepreg lamination). A copper-tin IMC may also be reduced or eliminated by adding a barrier layer between the copper layer and the tin layer, where the barrier layer material includes an etching selectivity that is similar to nickel. The use of nickel as the metal protection layer 240 may provide additional advantages, as the eutectic temperature required to form an IMC between nickel and copper is greater than 1000° C., much higher than the prepreg lamination temperature of approximately 220° C. Additionally, measurements of metal reflectivity of tin and nickel exhibit a comparable reflectance at the $CO_2$ laser wavelength of approximately 10 μm. Because of this comparable reflectance, nickel or tin can be used as an effective metal protection layer for $CO_2$ laser skiving.

Figure 2D:
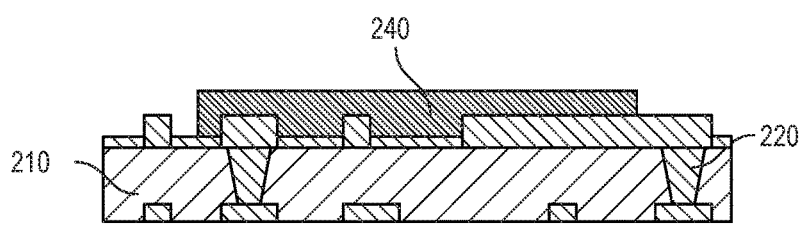
Figure 2E:
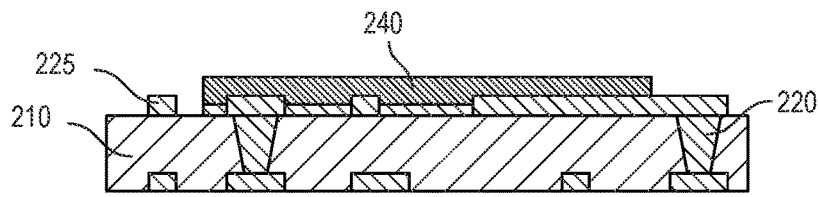
Figure 2F:
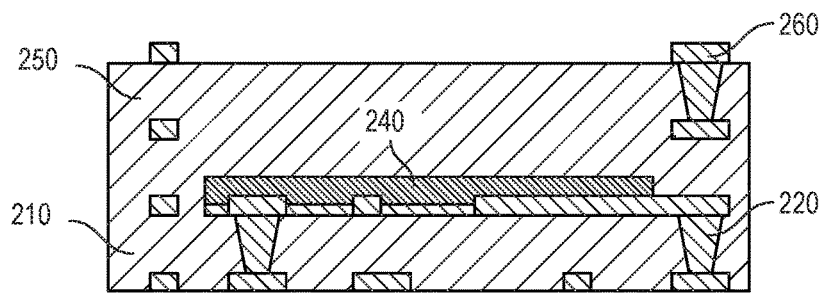

FIG. 2D shows the removal of the protection layer border 230, which exposes the metal protection layer 240 and portions of the cavity routing interconnects 220. FIG. 2E shows the removal of a portion of the cavity routing interconnects 220. In an example, this removal includes a copper seed etch, and allows for isolation of one or more conductors 225 from other portions of the cavity routing interconnects 220. FIG. 2F shows building additional layers, which may include adding additional dielectric material 250 and adding additional vias 260 or other conductive structures.

Figure 2G:
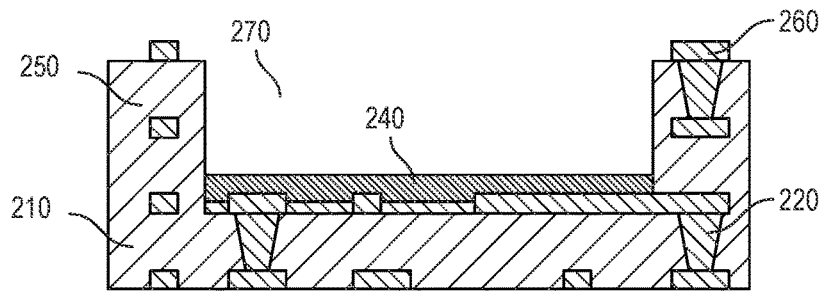

FIG. 2G shows the formation of a cavity 270, where cavity 270 is formed in an interior portion of the additional dielectric material 250. Cavity 270 may be formed using laser skiving, where the reflectivity of the metal protection layer 240 forms a laser stop (e.g., precise lower boundary) for the laser-skived cavity 270. Even if a portion of the metal protection layer 240 is unintentionally removed through laser skiving or drilling, the remaining metal protection layer 240 protects the underlying cavity routing interconnects 220. In contrast to alternate processes that create a cavity by using a release layer around the removed portion, the use of laser-skiving to remove a portion of the additional dielectric material 250 does not leave a release layer on the cavity wall. The presence of a release layer on the interior cavity walls may be used to detect the use of the laser-skiving process to remove a portion of the additional dielectric material 250.

Figure 2H:
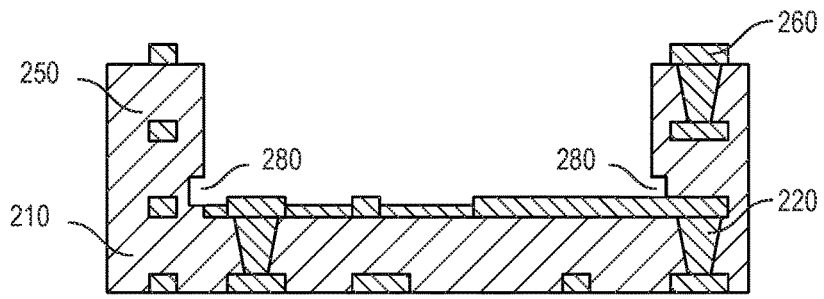

FIG. 2H shows the removal (e.g., etching) of the metal protection layer 240, which reveals the underlying cavity routing interconnects 220. The etching of the metal protection layer 240 may result in an undercut 280 within the cavity, where the undercut 280 may be used to detect the use of this etching step.

Figure 2I:
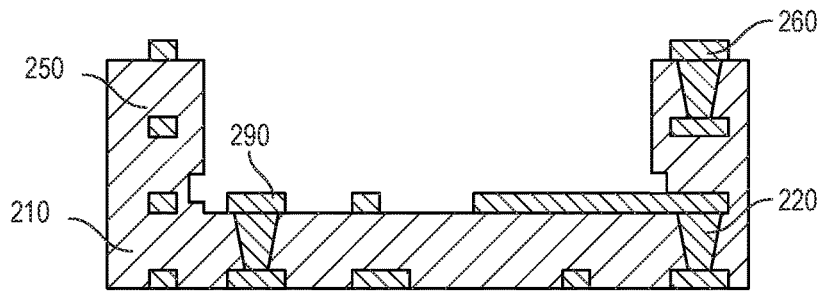

FIG. 2I shows an etching of a portion of the cavity routing interconnects 220. The etching may be performed using a surface roughening agent (e.g., CZ etching agent), a chemical mordant, or other etching agent. This etching removes connecting portions, and electrically isolates one or more vertical vias 290, fan-out vias 220, or other conductors. The etching process may also leave a roughened surface on fan-out vias 220 or other conductors, and the roughened surface may be used to detect the use of this etching process. Similarly, the presence of a fan-out via 220 in the cavity that continues into the substrate 210 and the absence of a laser ring guard may be used to detect the use of the metal protection layer process shown in FIGS. 2A-2I.

Figure 3:
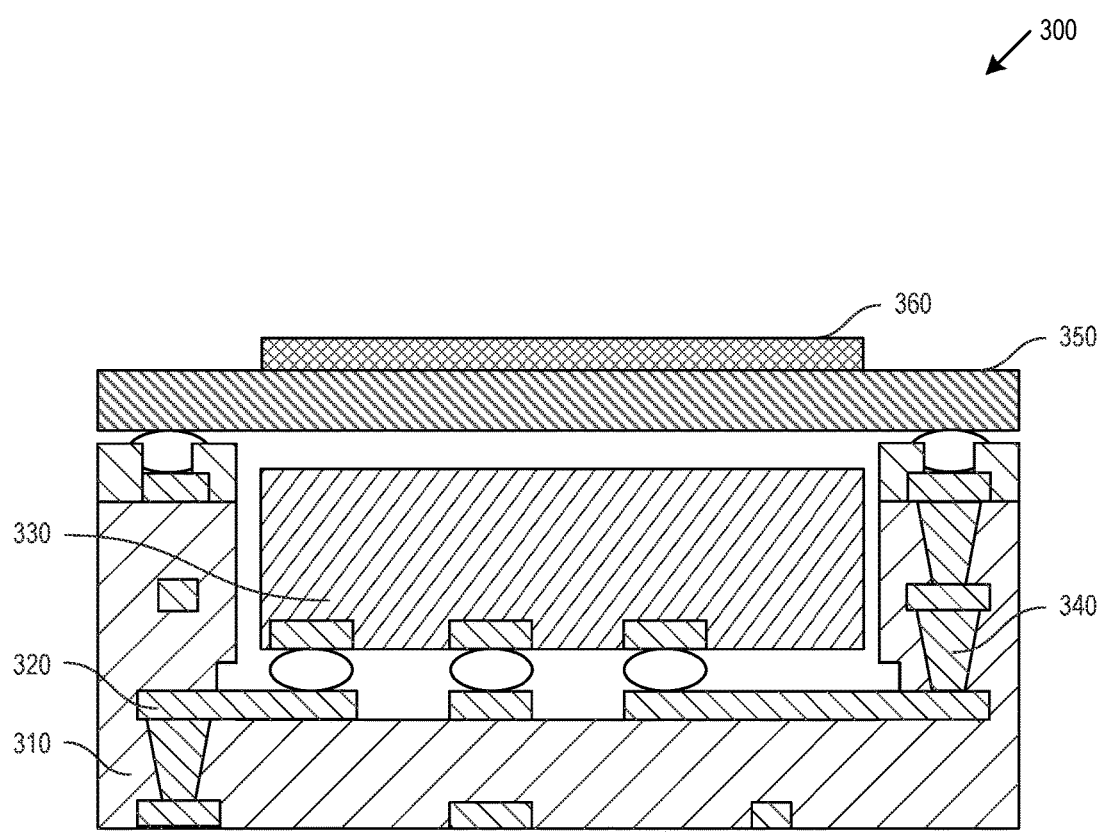
FIG. 3 is a block diagram of an assembled fan-out cavity PoP structure, in accordance with at least one embodiment of the invention.

FIG. 3 is a block diagram of an assembled fan-out cavity PoP structure 300, in accordance with at least one embodiment of the invention. The PoP structure 300 includes a first substrate 310, which includes a lower fan-out via 320. The first substrate 310 includes a first package 330 within a cavity formed using the process shown in FIGS. 2A-2I. The lower fan-out via 320 provide escape routing traces (e.g., conductive traces) from the first package 330 to contacts on a bottom surface of the first substrate 310. As shown in FIG. 3, lower fan-out via 330 provides a connection between the first package 330 and a lower contact beyond the width of the first package 330, while supporting standard vertical via connections. The PoP structure 300 includes an upper fan-out via 340 that provides an escape routing trace from the first package 330 to a second substrate 350 and a second die 360. The second substrate 350 and second die 360 form a second package, and together the first package 330 and second package form the package-on-package (PoP) structure 300. Additional dies, packages, or routing traces may be added, such as using the cavity formation process shown in FIGS. 2A-2I.

Figure 4:
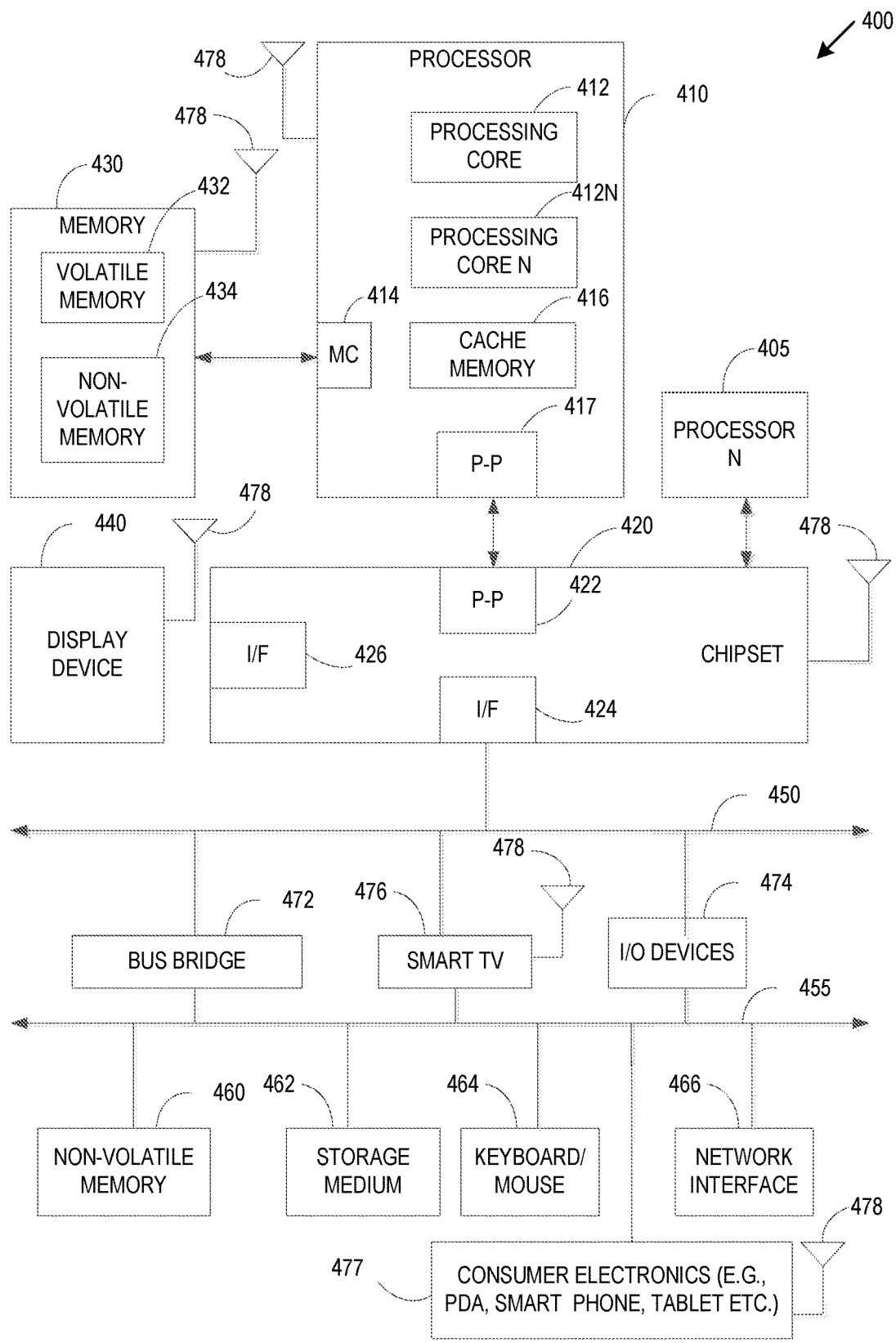
FIG. 4 illustrates a system level diagram, in accordance with at least one embodiment of the invention.

FIG. 4 illustrates a system level diagram, in accordance with at least one embodiment of the invention. For instance, FIG. 4 depicts an example of an electronic device (e.g., system) including a metal protected fan-out cavity apparatus or method as described in the present disclosure. FIG. 4 is included to show an example of a higher-level device application. In one embodiment, the system includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 400 is a system on a chip (SOC) system.

In one embodiment, processor 410 has one or more processing cores 412 and 412N, where 412N represents the Nth processor core inside processor 410 where N is a positive integer. In one embodiment, system 400 includes multiple processors including 410 and 405, where processor 405 has logic similar or identical to the logic of processor 410. In some embodiments, processing core 412 includes, but is not limited to, pre-fetch logic to fetch instructions, decode logic to decode the instructions, execution logic to execute instructions, and the like. In some embodiments, processor 410 has a cache memory 416 to cache instructions and/or data for system 400. Cache memory 416 may be organized into a hierarchal structure including one or more levels of cache memory 416.

In some embodiments, processor 410 includes a memory controller 414, which is operable to perform functions that enable the processor 410 to access and communicate with memory 430 that includes a volatile memory 432 and/or a non-volatile memory 434. In some embodiments, processor 410 is coupled with memory 430 and chipset 420. Processor 410 may also be coupled to a wireless antenna 478 to communicate with any device configured to transmit and/or receive wireless signals. In one embodiment, the wireless antenna interface 478 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 432 includes, but is not limited to, synchronous dynamic random access memory (SDRAM), dynamic random access memory (DRAM), RAMBUS dynamic random access memory (RDRAM), and/or any other type of random access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In one embodiment, memory 430 may also store temporary variables or other intermediate information while processor 410 is executing instructions. In the illustrated embodiment, chipset 420 connects with processor 410 via Point-to-Point (PtP, P-P, P2P) interfaces 417 and 422. Chipset 420 enables processor 410 to connect to other elements in system 400. In some embodiments, interfaces 417 and 422 operate in accordance with a PtP communication protocol such as the Intel® QuickPath Interconnect (QPI) or the like. In other embodiments, a different interconnect may be used.

In some embodiments, chipset 420 is operable to communicate with processor 410, 405, display device 440, and other devices 472, 476, 474, 460, 462, 464, 466, 477, and so forth. Chipset 420 may also be coupled to a wireless antenna 478 to communicate with any device configured to transmit and/or receive wireless signals.

Chipset 420 connects to display device 440 via interface 426. Display device 440 may be, for example, a liquid crystal display (LCD), a plasma display, cathode ray tube (CRT) display, or any other form of visual display device. In some embodiments, processor 410 and chipset 420 are merged into a single SOC. In addition, chipset 420 connects to one or more buses 450 and 455 that interconnect various elements 474, 460, 462, 464, and 466. Buses 450 and 455 may be interconnected together via a bus bridge 472. In one embodiment, chipset 420 couples with a non-volatile memory 460, mass storage device(s) 462, keyboard/mouse 464, and network interface 466 via interface 424 and/or 404, smart TV 476, consumer electronics 477, and so forth.

In one embodiment, mass storage device 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a peripheral component interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into processor core 412.

To better illustrate the method and apparatuses disclosed herein, a non-limiting list of embodiments is provided here.

Example 1 is an electronic device comprising: a semiconductor die disposed within a cavity of a substrate; at least one conductive interconnect partially exposed within the cavity and partially embedded within the substrate; and wherein the cavity is formed by a process including: forming a protection layer over the at least one conductive interconnect in an area where the cavity is to be formed; forming a dielectric layer over the protection layer and over the substrate in an area larger than the area where the cavity is to be formed; laser cutting the cavity down to the protection layer; and etching the protection layer away within the cavity to expose a portion of the at least one conductive interconnect.

In Example 2, the subject matter of Example 1 optionally includes wherein the protection layer includes a metal protection layer.

In Example 3, the subject matter of Example 2 optionally includes wherein the metal protection layer includes a nickel protection layer.

In Example 4, the subject matter of any one or more of Examples 2-3 optionally include wherein the metal protection layer includes a tin protection layer.

In Example 5, the subject matter of any one or more of Examples 1-4 optionally include wherein the at least one conductive interconnect includes a conductive via fan-out.

In Example 6, the subject matter of Example 5 optionally includes a die disposed on the at least one conductive interconnect subsequent to the removal of the protection layer.

In Example 7, the subject matter of Example 6 optionally includes wherein: the conductive via fan-out includes a lower vertical via connection; and the at least one conductive interconnect provides a lower connection between the die and the lower vertical via connection.

In Example 8, the subject matter of any one or more of Examples 5-7 optionally include a cavity package disposed within the cavity on the at least one conductive interconnect subsequent to the removal of the protection layer.

In Example 9, the subject matter of Example 8 optionally includes an upper package disposed over the cavity package and cavity on an upper contact.

In Example 10, the subject matter of Example 9 optionally includes wherein: the conductive via fan-out includes an upper vertical via connection to the upper contact; and the at least one conductive interconnect provides an upper connection between the first package through the upper vertical via connection to the upper package.

In Example 11, the subject matter of any one or more of Examples 1-10 optionally include wherein the protection layer is electroplated.

In Example 12, the subject matter of any one or more of Examples 1-11 optionally include wherein the protection layer is selected to include a high laser reflectivity to form a laser-stop layer lower boundary.

In Example 13, the subject matter of any one or more of Examples 1-12 optionally include wherein the protection layer is selected to include a high etching selectivity compared to the conductive interconnect.

In Example 14, the subject matter of Example 13 optionally includes wherein the conductive interconnect includes copper.

In Example 15, the subject matter of Example 14 optionally includes wherein the protection layer is selected to avoid forming an intermetallic compound (IMC) between the conductive interconnect and the protection layer.

Example 16 is a method comprising: forming a cavity within a substrate including: forming a protection layer over at least one conductive interconnect in an area where the cavity is to be formed, the at least one conductive interconnect partially exposed within the cavity and partially embedded within the substrate; forming a dielectric layer over the protection layer and over the substrate in an area larger than the area where the cavity is to be formed; laser cutting the cavity down to the protection layer; and etching the protection layer away within the cavity to expose a portion of the at least one conductive interconnect.

In Example 17, the subject matter of Example 16 optionally includes wherein the protection layer includes a metal protection layer.

In Example 18, the subject matter of Example 17 optionally includes wherein the metal protection layer includes a nickel protection layer.

In Example 19, the subject matter of any one or more of Examples 17-18 optionally include wherein the metal protection layer includes a tin protection layer.

In Example 20, the subject matter of any one or more of Examples 16-19 optionally include wherein the at least one conductive interconnect includes a conductive via fan-out.

In Example 21, the subject matter of Example 20 optionally includes disposing a die on the at least one conductive interconnect subsequent to the removal of the protection layer.

In Example 22, the subject matter of Example 21 optionally includes wherein: the conductive via fan-out includes a lower vertical via connection; and the at least one conductive interconnect provides a lower connection between the die and the lower vertical via connection.

In Example 23, the subject matter of any one or more of Examples 20-22 optionally include disposing a cavity package within the cavity on the at least one conductive interconnect subsequent to the removal of the protection layer.

In Example 24, the subject matter of Example 23 optionally includes disposing an upper package over the cavity package and cavity on an upper contact.

In Example 25, the subject matter of Example 24 optionally includes wherein: the conductive via fan-out includes an upper vertical via connection to the upper contact; and the at least one conductive interconnect provides an upper connection between the first package through the upper vertical via connection to the upper package.

In Example 26, the subject matter of any one or more of Examples 16-25 optionally include wherein the protection layer is electroplated.

In Example 27, the subject matter of any one or more of Examples 16-26 optionally include wherein the protection layer is selected to include a high laser reflectivity to form a laser-stop layer lower boundary.

In Example 28, the subject matter of any one or more of Examples 16-27 optionally include wherein the protection layer is selected to include a high etching selectivity compared to the conductive interconnect.

In Example 29, the subject matter of Example 28 optionally includes wherein the conductive interconnect includes copper.

In Example 30, the subject matter of Example 29 optionally includes wherein the protection layer is selected to avoid forming an intermetallic compound (IMC) between the conductive interconnect and the protection layer.

Example 31 is at least one machine-readable medium including instructions, which when executed by a computing system, cause the computing system to perform any of the methods of Examples 16-30.

Example 32 is an apparatus comprising means for performing any of the methods of Examples 16-30.

Example 33 is at least one machine-readable storage medium, comprising a plurality of instructions that, responsive to being executed with processor circuitry of a computer-controlled device, cause the computer-controlled device to: form a cavity within a substrate including: form a protection layer over at least one conductive interconnect in an area where the cavity is to be formed, the at least one conductive interconnect partially exposed within the cavity and partially embedded within the substrate; forming a dielectric layer over the protection layer and over the substrate in an area larger than the area where the cavity is to be formed; laser cutting the cavity down to the protection layer; and etching the protection layer away within the cavity to expose a portion of the at least one conductive interconnect.

In Example 34, the subject matter of Example 33 optionally includes wherein the protection layer includes a metal protection layer.

In Example 35, the subject matter of Example 34 optionally includes wherein the metal protection layer includes a nickel protection layer.

In Example 36, the subject matter of any one or more of Examples 34-35 optionally include wherein the metal protection layer includes a tin protection layer.

In Example 37, the subject matter of any one or more of Examples 33-36 optionally include wherein the at least one conductive interconnect includes a conductive via fan-out.

In Example 38, the subject matter of Example 37 optionally includes the instructions further causing the computer-controlled device to dispose a die on the at least one conductive interconnect subsequent to the removal of the protection layer.

In Example 39, the subject matter of Example 38 optionally includes wherein: the conductive via fan-out includes a lower vertical via connection; and the at least one conductive interconnect provides a lower connection between the die and the lower vertical via connection.

In Example 40, the subject matter of any one or more of Examples 37-39 optionally include the instructions further causing the computer-controlled device to dispose a cavity package within the cavity on the at least one conductive interconnect subsequent to the removal of the protection layer.

In Example 41, the subject matter of Example 40 optionally includes the instructions further causing the computer-controlled device to dispose an upper package over the cavity package and cavity on an upper contact.

In Example 42, the subject matter of Example 41 optionally includes wherein: the conductive via fan-out includes an upper vertical via connection to the upper contact; and the at least one conductive interconnect provides an upper connection between the first package through the upper vertical via connection to the upper package.

In Example 43, the subject matter of any one or more of Examples 33-42 optionally include wherein the protection layer is electroplated.

In Example 44, the subject matter of any one or more of Examples 33-43 optionally include wherein the protection layer is selected to include a high laser reflectivity to form a laser-stop layer lower boundary.

In Example 45, the subject matter of any one or more of Examples 33-44 optionally include wherein the protection layer is selected to include a high etching selectivity compared to the conductive interconnect.

In Example 46, the subject matter of Example 45 optionally includes wherein the conductive interconnect includes copper.

In Example 47, the subject matter of Example 46 optionally includes wherein the protection layer is selected to avoid forming an intermetallic compound (IMC) between the conductive interconnect and the protection layer.

Example 48 is an interconnect apparatus comprising: means for forming a cavity within a substrate including: means for forming a protection layer over at least one conductive interconnect in an area where the cavity is to be formed, the at least one conductive interconnect partially exposed within the cavity and partially embedded within the substrate; means for forming a dielectric layer over the protection layer and over the substrate in an area larger than the area where the cavity is to be formed; means for laser cutting the cavity down to the protection layer; and means for etching the protection layer away within the cavity to expose a portion of the at least one conductive interconnect.

In Example 49, the subject matter of Example 48 optionally includes wherein the protection layer includes a metal protection layer.

In Example 50, the subject matter of Example 49 optionally includes wherein the metal protection layer includes a nickel protection layer.

In Example 51, the subject matter of any one or more of Examples 49-50 optionally include wherein the metal protection layer includes a tin protection layer.

In Example 52, the subject matter of any one or more of Examples 48-51 optionally include wherein the at least one conductive interconnect includes a conductive via fan-out.

In Example 53, the subject matter of Example 52 optionally includes means for disposing a die on the at least one conductive interconnect subsequent to the removal of the protection layer.

In Example 54, the subject matter of Example 53 optionally includes wherein: the conductive via fan-out includes a lower vertical via connection; and the at least one conductive interconnect provides a lower connection between the die and the lower vertical via connection.

In Example 55, the subject matter of any one or more of Examples 53-54 optionally include means for disposing a cavity package within the cavity on the at least one conductive interconnect subsequent to the removal of the protection layer.

In Example 56, the subject matter of Example 55 optionally includes means for disposing an upper package over the cavity package and cavity on an upper contact.

In Example 57, the subject matter of Example 56 optionally includes wherein: the conductive via fan-out includes an upper vertical via connection to the upper contact; and the at least one conductive interconnect provides an upper connection between the first package through the upper vertical via connection to the upper package.

In Example 58, the subject matter of any one or more of Examples 48-57 optionally include wherein the protection layer is electroplated.

In Example 59, the subject matter of any one or more of Examples 48-58 optionally include wherein the protection layer is selected to include a high laser reflectivity to form a laser-stop layer lower boundary.

In Example 60, the subject matter of any one or more of Examples 48-59 optionally include wherein the protection layer is selected to include a high etching selectivity compared to the conductive interconnect.

In Example 61, the subject matter of Example 60 optionally includes wherein the conductive interconnect includes copper.

In Example 62, the subject matter of Example 61 optionally includes wherein the protection layer is selected to avoid forming an intermetallic compound (IMC) between the conductive interconnect and the protection layer.

Example 63 is an electronic device comprising: a semiconductor die disposed within a laser cut cavity of a substrate; at least one conductive interconnect partially exposed within the laser cut cavity and partially embedded within the substrate; and wherein the laser cut cavity includes an etched undercut.

In Example 64, the subject matter of Example 63 optionally includes wherein the conductive interconnect includes a conductive via fan-out.

In Example 65, the subject matter of Example 64 optionally includes wherein: the conductive via fan-out includes a lower vertical via connection embedded within the substrate; and the conductive interconnect provides a lower connection between the semiconductor die and the lower vertical via connection.

In Example 66, the subject matter of any one or more of Examples 64-65 optionally include an upper package disposed over the semiconductor die and cavity on an upper contact.

In Example 67, the subject matter of Example 66 optionally includes wherein: the conductive via fan-out includes an upper vertical via connection to the upper contact; and the at least one conductive interconnect provides an upper connection between the semiconductor die through the upper vertical via connection to the upper package.

In Example 68, the subject matter of any one or more of Examples 63-67 optionally include wherein the etched undercut was formed by removal of a removable protection layer, the removal of the removable protection layer subsequent to a laser cutting of the laser cut cavity, the removal of the removable protection layer causing the at least one conductive interconnect to be partially exposed.

In Example 69, the subject matter of Example 68 optionally includes wherein the removable protection layer was electroplated on the at least one conductive interconnect.

In Example 70, the subject matter of any one or more of Examples 68-69 optionally include wherein the removable protection layer is selected to include a high laser reflectivity to form a laser-stop layer lower boundary.

In Example 71, the subject matter of any one or more of Examples 68-70 optionally include wherein the removal of the removable protection layer includes etching the removable protection layer, the etching of the removable protection layer generating the etched undercut within the laser cut cavity.

In Example 72, the subject matter of Example 71 optionally includes wherein the removable protection layer is selected to include a high etching selectivity compared to the conductive interconnect.

In Example 73, the subject matter of Example 72 optionally includes wherein: the conductive interconnect includes copper; and the removable protection layer is selected to include nickel.

In Example 74, the subject matter of Example 73 optionally includes wherein the removable protection layer is selected to avoid forming an intermetallic compound (IMC) between the conductive interconnect and the removable protection layer.

In Example 75, the subject matter of any one or more of Examples 72-74 optionally include wherein: the conductive interconnect includes copper; and the removable protection layer is selected to include tin.

Example 76 is a method comprising: laser cutting a cavity within a substrate; etching a protection layer subsequent to laser cutting the cavity, the etching to remove the protection layer from the substrate, to form an etched undercut within the cavity, and to expose a portion of at least one conductive interconnect within the cavity, wherein the at least one conductive interconnect is partially embedded within the substrate; and disposing a semiconductor die within the cavity of a substrate.

In Example 77, the subject matter of Example 76 optionally includes wherein the conductive interconnect includes a conductive via fan-out.

In Example 78, the subject matter of Example 77 optionally includes wherein: the conductive via fan-out includes a lower vertical via connection embedded within the substrate; and the conductive interconnect provides a lower connection between the semiconductor die and the lower vertical via connection.

In Example 79, the subject matter of any one or more of Examples 77-78 optionally include disposing an upper package over the semiconductor die and cavity on an upper contact.

In Example 80, the subject matter of Example 79 optionally includes wherein: the conductive via fan-out includes an upper vertical via connection to the upper contact; and the at least one conductive interconnect provides an upper connection between the semiconductor die through the upper vertical via connection to the upper package.

In Example 81, the subject matter of any one or more of Examples 76-80 optionally include electroplating the protection layer on the at least one conductive interconnect prior to laser cutting the cavity within the substrate.

In Example 82, the subject matter of any one or more of Examples 76-81 optionally include wherein the protection layer is selected to include a high laser reflectivity to form a laser-stop layer lower boundary.

In Example 83, the subject matter of any one or more of Examples 76-82 optionally include wherein the protection layer is selected to include a high etching selectivity compared to the conductive interconnect.

In Example 84, the subject matter of Example 83 optionally includes wherein: the conductive interconnect includes copper; and the protection layer is selected to include nickel.

In Example 85, the subject matter of Example 84 optionally includes wherein the protection layer is selected to avoid forming an intermetallic compound (IMC) between the conductive interconnect and the protection layer.

In Example 86, the subject matter of any one or more of Examples 83-85 optionally include wherein: the conductive interconnect includes copper; and the protection layer is selected to include tin.

Example 87 is at least one machine-readable medium including instructions, which when executed by a computing system, cause the computing system to perform any of the methods of Examples 76-86.

Example 88 is an apparatus comprising means for performing any of the methods of Examples 76-86.

Example 89 is at least one machine-readable storage medium, comprising a plurality of instructions that, responsive to being executed with processor circuitry of a computer-controlled device, cause the computer-controlled device to: laser cut a cavity within a substrate; etch a protection layer subsequent to laser cutting the cavity, the etching to remove the protection layer from the substrate, to form an etched undercut within the cavity, and to expose a portion of at least one conductive interconnect within the cavity, wherein the at least one conductive interconnect is partially embedded within the substrate; and dispose a semiconductor die within the cavity of a substrate.

In Example 90, the subject matter of Example 89 optionally includes wherein the conductive interconnect includes a conductive via fan-out.

In Example 91, the subject matter of Example 90 optionally includes wherein: the conductive via fan-out includes a lower vertical via connection embedded within the substrate; and the conductive interconnect provides a lower connection between the semiconductor die and the lower vertical via connection.

In Example 92, the subject matter of any one or more of Examples 90-91 optionally include the instructions further causing the computer-controlled device to dispose an upper package over the semiconductor die and cavity on an upper contact.

In Example 93, the subject matter of Example 92 optionally includes wherein: the conductive via fan-out includes an upper vertical via connection to the upper contact; and the at least one conductive interconnect provides an upper connection between the semiconductor die through the upper vertical via connection to the upper package.

In Example 94, the subject matter of any one or more of Examples 89-93 optionally include the instructions further causing the computer-controlled device to electroplate the protection layer on the at least one conductive interconnect prior to laser cutting the cavity within the substrate.

In Example 95, the subject matter of any one or more of Examples 89-94 optionally include wherein the protection layer is selected to include a high laser reflectivity to form a laser-stop layer lower boundary.

In Example 96, the subject matter of any one or more of Examples 89-95 optionally include wherein the protection layer is selected to include a high etching selectivity compared to the conductive interconnect.

In Example 97, the subject matter of Example 96 optionally includes wherein: the conductive interconnect includes copper; and the protection layer is selected to include nickel.

In Example 98, the subject matter of Example 97 optionally includes wherein the protection layer is selected to avoid forming an intermetallic compound (IMC) between the conductive interconnect and the protection layer.

In Example 99, the subject matter of any one or more of Examples 96-98 optionally include wherein: the conductive interconnect includes copper; and the protection layer is selected to include tin.

Example 100 is an electronic device comprising: means for laser cutting a cavity within a substrate; means for etching a protection layer subsequent to laser cutting the cavity, the etching to remove the protection layer from the substrate, to form an etched undercut within the cavity, and to expose a portion of at least one conductive interconnect within the cavity, wherein the at least one conductive interconnect is partially embedded within the substrate; and means for disposing a semiconductor die within the cavity of a substrate.

In Example 101, the subject matter of Example 100 optionally includes wherein the conductive interconnect includes a conductive via fan-out.

In Example 102, the subject matter of Example 101 optionally includes wherein: the conductive via fan-out includes a lower vertical via connection embedded within the substrate; and the conductive interconnect provides a lower connection between the semiconductor die and the lower vertical via connection.

In Example 103, the subject matter of any one or more of Examples 101-102 optionally include means for disposing an upper package over the semiconductor die and cavity on an upper contact.

In Example 104, the subject matter of Example 103 optionally includes wherein: the conductive via fan-out includes an upper vertical via connection to the upper contact; and the at least one conductive interconnect provides an upper connection between the semiconductor die through the upper vertical via connection to the upper package.

In Example 105, the subject matter of any one or more of Examples 100-104 optionally include means for electroplating the protection layer on the at least one conductive interconnect prior to laser cutting the cavity within the substrate.

In Example 106, the subject matter of any one or more of Examples 100-105 optionally include wherein the protection layer is selected to include a high laser reflectivity to form a laser-stop layer lower boundary.

In Example 107, the subject matter of any one or more of Examples 100-106 optionally include wherein the protection layer is selected to include a high etching selectivity compared to the conductive interconnect.

In Example 108, the subject matter of Example 107 optionally includes wherein: the conductive interconnect includes copper; and the protection layer is selected to include nickel.

In Example 109, the subject matter of Example 108 optionally includes wherein the protection layer is selected to avoid forming an intermetallic compound (IMC) between the conductive interconnect and the protection layer.

In Example 110, the subject matter of any one or more of Examples 107-109 optionally include wherein: the conductive interconnect includes copper; and the protection layer is selected to include tin.

Example 111 is an interconnect apparatus comprising: a conductive layer disposed on a first dielectric layer, the conductive layer including a conductive interconnect; a metal protection layer disposed on a first portion of the conductive interconnect, wherein the metal protection layer is not disposed on a second portion of the conductive interconnect; and a second dielectric layer disposed on the metal protection layer and on the second portion of the conductive interconnect, wherein a portion of the second dielectric layer is removed to expose the metal protection layer; wherein the metal protection layer is removable to expose the first portion of the conductive interconnect.

In Example 112, the subject matter of Example 111 optionally includes wherein the conductive interconnect includes a conductive via fan-out.

In Example 113, the subject matter of Example 112 optionally includes a die disposed on the first portion of the conductive interconnect subsequent to the removal of the metal protection layer.

In Example 114, the subject matter of Example 113 optionally includes wherein: the conductive via fan-out includes a lower vertical via connection below the second portion of the conductive interconnect; and the conductive interconnect provides a lower connection between the die and the lower vertical via connection.

In Example 115, the subject matter of any one or more of Examples 112-114 optionally include a cavity package disposed within the cavity on the at least one conductive interconnect subsequent to the removal of the protection layer.

In Example 116, the subject matter of Example 115 optionally includes an upper package disposed over the cavity package and cavity on an upper contact.

In Example 117, the subject matter of Example 116 optionally includes wherein: the conductive via fan-out includes an upper vertical via connection to the upper contact; and the at least one conductive interconnect provides an upper connection between the first package through the upper vertical via connection to the second package.

In Example 118, the subject matter of any one or more of Examples 111-117 optionally include wherein the metal protection layer is electroplated on the first portion of the conductive interconnect.

In Example 119, the subject matter of any one or more of Examples 111-118 optionally include wherein removal of the portion of the second dielectric layer includes laser skiving the portion of the second dielectric layer.

In Example 120, the subject matter of Example 119 optionally includes wherein the metal protection layer is selected to include a high laser reflectivity to form a laser-stop layer lower boundary.

In Example 121, the subject matter of any one or more of Examples 111-120 optionally include wherein removing the metal protection layer includes etching the metal protection layer.

In Example 122, the subject matter of Example 121 optionally includes wherein the metal protection layer is selected to include a high etching selectivity compared to the conductive layer.

In Example 123, the subject matter of Example 122 optionally includes wherein: the conductive layer includes copper; and the metal protection layer is selected to include nickel.

In Example 124, the subject matter of Example 123 optionally includes wherein the metal protection layer is selected to avoid forming an intermetallic compound (IMC) between the conductive layer and the metal protection layer.

In Example 125, the subject matter of any one or more of Examples 122-124 optionally include wherein: the conductive layer includes copper; and the metal protection layer is selected to include tin.

In Example 126, the subject matter of any one or more of Examples 111-125 optionally include a removable protection layer border disposed on the first dielectric layer prior to the metal protection layer being disposed on the first portion of the conductive interconnect, the removable protection layer border to provide an outer perimeter for the metal protection layer.

In Example 127, the subject matter of Example 126 optionally includes wherein the removable protection layer border is removed subsequent to the metal protection layer being disposed on the first portion of the conductive interconnect.

In Example 128, the subject matter of any one or more of Examples 111-127 optionally include a first conductor portion of the conductive layer etched to isolate at least one separated conductor prior to disposing the second dielectric layer, wherein the metal protection layer is not disposed on the first conductor portion of the conductive layer.

In Example 129, the subject matter of any one or more of Examples 111-128 optionally include a second conductor portion of the conductive layer etched to isolate at least one protected conductor subsequent to removing the metal protection layer, wherein the metal protection layer was previously disposed on the second conductor portion of the conductive layer.

Example 130 is a method comprising: disposing a conductive layer on a first dielectric layer, the conductive layer including a conductive interconnect; disposing a metal protection layer on a first portion of the conductive interconnect, wherein the metal protection layer is not disposed on a second portion of the conductive interconnect; disposing a second dielectric layer on the metal protection layer and on the second portion of the conductive interconnect; removing a portion of the second dielectric layer to expose the metal protection layer; and removing the metal protection layer to expose the first portion of the conductive interconnect.

In Example 131, the subject matter of Example 130 optionally includes wherein the conductive interconnect includes a conductive via fan-out.

In Example 132, the subject matter of Example 131 optionally includes disposing a die on the first portion of the conductive interconnect subsequent to removing the metal protection layer.

In Example 133, the subject matter of Example 132 optionally includes wherein: the conductive via fan-out includes a lower vertical via connection below the second portion of the conductive interconnect; and the conductive interconnect provides a lower connection between the die and the lower vertical via connection.

In Example 134, the subject matter of any one or more of Examples 131-133 optionally include disposing a cavity package within the cavity on the at least one conductive interconnect subsequent to the removal of the protection layer.

In Example 135, the subject matter of Example 134 optionally includes disposing an upper package over the cavity package and cavity on an upper contact.

In Example 136, the subject matter of Example 135 optionally includes wherein: the conductive via fan-out includes an upper vertical via connection to the upper contact; and the at least one conductive interconnect provides an upper connection between the first package through the upper vertical via connection to the upper package.

In Example 137, the subject matter of any one or more of Examples 130-136 optionally include wherein disposing the metal protection layer includes electroplating the metal protection layer on the first portion of the conductive interconnect.

In Example 138, the subject matter of any one or more of Examples 130-137 optionally include wherein removing the portion of the second dielectric layer includes laser skiving the portion of the second dielectric layer.

In Example 139, the subject matter of Example 138 optionally includes wherein the metal protection layer is selected to include a high laser reflectivity to form a laser-stop layer lower boundary.

In Example 140, the subject matter of any one or more of Examples 130-139 optionally include wherein removing the metal protection layer includes etching the metal protection layer.

In Example 141, the subject matter of Example 140 optionally includes wherein the metal protection layer is selected to include a high etching selectivity compared to the conductive layer.

In Example 142, the subject matter of Example 141 optionally includes wherein: the conductive layer includes copper; and the metal protection layer is selected to include nickel.

In Example 143, the subject matter of Example 142 optionally includes wherein the metal protection layer is selected to avoid forming an intermetallic compound (IMC) between the conductive layer and the metal protection layer.

In Example 144, the subject matter of any one or more of Examples 141-143 optionally include wherein: the conductive layer includes copper; and the metal protection layer is selected to include tin.

In Example 145, the subject matter of any one or more of Examples 130-144 optionally include disposing a removable protection layer border on the first dielectric layer prior to disposing the metal protection layer on the first portion of the conductive interconnect, the removable protection layer border to provide an outer perimeter for the metal protection layer.

In Example 146, the subject matter of Example 145 optionally includes removing the removable protection layer border subsequent to disposing the metal protection layer on the first portion of the conductive interconnect.

In Example 147, the subject matter of any one or more of Examples 130-146 optionally include etching a first conductor portion of the conductive layer to isolate at least one separated conductor prior to disposing the second dielectric layer, wherein the metal protection layer is not disposed on the first conductor portion of the conductive layer.

In Example 148, the subject matter of any one or more of Examples 130-147 optionally include etching a second conductor portion of the conductive layer to isolate at least one protected conductor subsequent to removing the metal protection layer, wherein the metal protection layer was previously disposed on the second conductor portion of the conductive layer.

Example 149 is at least one machine-readable medium including instructions, which when executed by a computing system, cause the computing system to perform any of the methods of Examples 130-148.

Example 150 is an apparatus comprising means for performing any of the methods of Examples 130-148.

Example 151 is at least one machine-readable storage medium, comprising a plurality of instructions that, responsive to being executed with processor circuitry of a computer-controlled device, cause the computer-controlled device to: dispose a conductive layer on a first dielectric layer, the conductive layer including a conductive interconnect; dispose a metal protection layer on a first portion of the conductive interconnect, wherein the metal protection layer is not disposed on a second portion of the conductive interconnect; dispose a second dielectric layer on the metal protection layer and on the second portion of the conductive interconnect; remove a portion of the second dielectric layer to expose the metal protection layer; and remove the metal protection layer to expose the first portion of the conductive interconnect.

In Example 152, the subject matter of Example 151 optionally includes wherein the conductive interconnect includes a conductive via fan-out.

In Example 153, the subject matter of Example 152 optionally includes the instructions further causing the computer-controlled device to dispose a die on the first portion of the conductive interconnect subsequent to removing the metal protection layer.

In Example 154, the subject matter of Example 153 optionally includes wherein: the conductive via fan-out includes a lower vertical via connection below the second portion of the conductive interconnect; and the conductive interconnect provides a lower connection between the die and the lower vertical via connection.

In Example 155, the subject matter of any one or more of Examples 152-154 optionally include the instructions further causing the computer-controlled device to dispose a cavity package within the cavity on the at least one conductive interconnect subsequent to the removal of the protection layer.

In Example 156, the subject matter of Example 155 optionally includes the instructions further causing the computer-controlled device to dispose an upper package over the cavity package and cavity on an upper contact.

In Example 157, the subject matter of Example 156 optionally includes wherein: the conductive via fan-out includes an upper vertical via connection to the upper contact; and the at least one conductive interconnect provides an upper connection between the first package through the upper vertical via connection to the upper package.

In Example 158, the subject matter of any one or more of Examples 151-157 optionally include the instructions further causing the computer-controlled device to electroplate the metal protection layer on the first portion of the conductive interconnect.

In Example 159, the subject matter of any one or more of Examples 151-158 optionally include the instructions further causing the computer-controlled device to laser skive the portion of the second dielectric layer.

In Example 160, the subject matter of Example 159 optionally includes wherein the metal protection layer is selected to include a high laser reflectivity to form a laser-stop layer lower boundary.

In Example 161, the subject matter of any one or more of Examples 151-160 optionally include the instructions further causing the computer-controlled device to etch the metal protection layer.

In Example 162, the subject matter of Example 161 optionally includes wherein the metal protection layer is selected to include a high etching selectivity compared to the conductive layer.

In Example 163, the subject matter of Example 162 optionally includes wherein: the conductive layer includes copper; and the metal protection layer is selected to include nickel.

In Example 164, the subject matter of Example 163 optionally includes wherein the metal protection layer is selected to avoid forming an intermetallic compound (IMC) between the conductive layer and the metal protection layer.

In Example 165, the subject matter of any one or more of Examples 162-164 optionally include wherein: the conductive layer includes copper; and the metal protection layer is selected to include tin.

In Example 166, the subject matter of any one or more of Examples 151-165 optionally include the instructions further causing the computer-controlled device to dispose a removable protection layer border on the first dielectric layer prior to disposing the metal protection layer on the first portion of the conductive interconnect, the removable protection layer border to provide an outer perimeter for the metal protection layer.

In Example 167, the subject matter of Example 166 optionally includes the instructions further causing the computer-controlled device to remove the removable protection layer border subsequent to disposing the metal protection layer on the first portion of the conductive interconnect.

In Example 168, the subject matter of any one or more of Examples 151-167 optionally include the instructions further causing the computer-controlled device to etch a first conductor portion of the conductive layer to isolate at least one separated conductor prior to disposing the second dielectric layer, wherein the metal protection layer is not disposed on the first conductor portion of the conductive layer.

In Example 169, the subject matter of any one or more of Examples 151-168 optionally include the instructions further causing the computer-controlled device to etch a second conductor portion of the conductive layer to isolate at least one protected conductor subsequent to removing the metal protection layer, wherein the metal protection layer was previously disposed on the second conductor portion of the conductive layer.

Example 170 is an interconnect apparatus comprising: means for disposing a conductive layer on a first dielectric layer, the conductive layer including a conductive interconnect; means for disposing a metal protection layer on a first portion of the conductive interconnect, wherein the metal protection layer is not disposed on a second portion of the conductive interconnect; means for disposing a second dielectric layer on the metal protection layer and on the second portion of the conductive interconnect; means for removing a portion of the second dielectric layer to expose the metal protection layer; and means for removing the metal protection layer to expose the first portion of the conductive interconnect.

In Example 171, the subject matter of Example 170 optionally includes wherein the conductive interconnect includes a conductive via fan-out.

In Example 172, the subject matter of Example 171 optionally includes means for disposing a die on the first portion of the conductive interconnect subsequent to removing the metal protection layer.

In Example 173, the subject matter of Example 172 optionally includes wherein: the conductive via fan-out includes a lower vertical via connection below the second portion of the conductive interconnect; and the conductive interconnect provides a lower connection between the die and the lower vertical via connection.

In Example 174, the subject matter of any one or more of Examples 172-173 optionally include means for disposing a cavity package within the cavity on the at least one conductive interconnect subsequent to the removal of the protection layer.

In Example 175, the subject matter of Example 174 optionally includes means for disposing an upper package over the cavity package and cavity on an upper contact.

In Example 176, the subject matter of Example 175 optionally includes wherein: the conductive via fan-out includes an upper vertical via connection to the upper contact; and the at least one conductive interconnect provides an upper connection between the first package through the upper vertical via connection to the upper package.

In Example 177, the subject matter of any one or more of Examples 170-176 optionally include wherein means for disposing the metal protection layer includes means for electroplating the metal protection layer on the first portion of the conductive interconnect.

In Example 178, the subject matter of any one or more of Examples 170-177 optionally include wherein means for removing the portion of the second dielectric layer includes means for laser skiving the portion of the second dielectric layer.

In Example 179, the subject matter of Example 178 optionally includes wherein the metal protection layer is selected to include a high laser reflectivity to form a laser-stop layer lower boundary.

In Example 180, the subject matter of any one or more of Examples 170-179 optionally include wherein means for removing the metal protection layer includes means for etching the metal protection layer.

In Example 181, the subject matter of Example 180 optionally includes wherein the metal protection layer is selected to include a high etching selectivity compared to the conductive layer.

In Example 182, the subject matter of Example 181 optionally includes wherein: the conductive layer includes copper; and the metal protection layer is selected to include nickel.

In Example 183, the subject matter of Example 182 optionally includes wherein the metal protection layer is selected to avoid forming an intermetallic compound (IMC) between the conductive layer and the metal protection layer.

In Example 184, the subject matter of any one or more of Examples 181-183 optionally include wherein: the conductive layer includes copper; and the metal protection layer is selected to include tin.

In Example 185, the subject matter of any one or more of Examples 170-184 optionally include means for disposing a removable protection layer border on the first dielectric layer prior to disposing the metal protection layer on the first portion of the conductive interconnect, the removable protection layer border to provide an outer perimeter for the metal protection layer.

In Example 186, the subject matter of Example 185 optionally includes means for removing the removable protection layer border subsequent to disposing the metal protection layer on the first portion of the conductive interconnect.

In Example 187, the subject matter of any one or more of Examples 170-186 optionally include means for etching a first conductor portion of the conductive layer to isolate at least one separated conductor prior to disposing the second dielectric layer, wherein the metal protection layer is not disposed on the first conductor portion of the conductive layer.

In Example 188, the subject matter of any one or more of Examples 170-187 optionally include means for etching a second conductor portion of the conductive layer to isolate at least one protected conductor subsequent to removing the metal protection layer, wherein the metal protection layer was previously disposed on the second conductor portion of the conductive layer.

These and other examples and features of the present molds, mold systems, and related methods will be set forth in part in the following detailed description. This overview is intended to provide non-limiting examples of the present subject matter—it is not intended to provide an exclusive or exhaustive explanation. The detailed description below is included to provide further information about the present molds, mold systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method comprising:
    forming a cavity within a substrate including:
        forming a protection layer over at least one conductive interconnect in an area where the cavity is to be formed, the at least one conductive interconnect partially exposed within the cavity and partially embedded within the substrate;
        forming a dielectric layer over the protection layer and over the substrate in an area larger than the area where the cavity is to be formed;
        laser cutting the cavity down to the protection layer; and
        etching the protection layer away within the cavity to expose a portion of the at least one conductive interconnect.

2. The method of claim 1, wherein the protection layer includes a metal protection layer.

3. The method of claim 1, wherein the at least one conductive interconnect includes a conductive via fan-out.

4. The method of claim 3, further including disposing a die on the at least one conductive interconnect subsequent to the removal of the protection layer.

5. The method of claim 4, wherein:
    the conductive via fan-out includes a lower vertical via connection; and
    the at least one conductive interconnect provides a lower connection between the die and the lower vertical via connection.

6. The method of claim 3, further including disposing a cavity package within the cavity on the at least one conductive interconnect subsequent to the removal of the protection layer.

7. The method of claim 6, further including disposing an upper package over the cavity package and cavity on an upper contact.

8. The method of claim 7, wherein:
    the conductive via fan-out includes an upper vertical via connection to the upper contact; and
    the at least one conductive interconnect provides an upper connection between the first package through the upper vertical via connection to the upper package.

* * * * *